(12) United States Patent
Morimoto et al.

(10) Patent No.: US 9,130,148 B2
(45) Date of Patent: Sep. 8, 2015

(54) PIEZOELECTRIC RESONATOR PLATE, PIEZOELECTRIC RESONATOR, METHOD FOR MANUFACTURING PIEZOELECTRIC RESONATOR PLATE, AND METHOD FOR MANUFACTURING PIEZOELECTRIC RESONATOR

(75) Inventors: Yoshinari Morimoto, Kakogawa (JP); Yoshinobu Sakamoto, Kakogawa (JP)

(73) Assignee: DAISHINKU CORPORATION, Kakogawa-shi (JP)

(*) Notice: Subject to any disclaimer, the term of this patent is extended or adjusted under 35 U.S.C. 154(b) by 281 days.

(21) Appl. No.: 13/881,262

(22) PCT Filed: Feb. 24, 2012

(86) PCT No.: PCT/JP2012/054611
§ 371 (c)(1),
(2), (4) Date: Apr. 24, 2013

(87) PCT Pub. No.: WO2012/115239
PCT Pub. Date: Aug. 30, 2012

(65) Prior Publication Data
US 2013/0221808 A1   Aug. 29, 2013

(30) Foreign Application Priority Data
Feb. 25, 2011   (JP) .................................. 2011-039414

(51) Int. Cl.
*H01L 41/047*    (2006.01)
*H03H 9/05*      (2006.01)
*H03H 9/17*      (2006.01)
*H03H 9/125*     (2006.01)
*H01L 41/29*     (2013.01)
(Continued)

(52) U.S. Cl.
CPC ............ *H01L 41/0475* (2013.01); *H01L 41/29* (2013.01); *H03H 3/02* (2013.01); *H03H 9/131* (2013.01); *H03H 9/132* (2013.01);
(Continued)

(58) Field of Classification Search
CPC ...................... G01C 19/5607; H03H 2003/026
USPC .................................. 310/348, 365, 366, 370
See application file for complete search history.

(56) References Cited

U.S. PATENT DOCUMENTS 5,521,457 A        5/1996   Kawasaki et al.
2010/0079962 A1    4/2010   Hashi
(Continued)

FOREIGN PATENT DOCUMENTS

DE    69421002 T2    5/2000
EP      626212 A2   11/1994
(Continued)

*Primary Examiner* — Thomas Dougherty
(74) *Attorney, Agent, or Firm* — Marvin A. Motsenbocker; Mots Law, PLLC

(57) ABSTRACT

A piezoelectric resonator plate includes at least a pair of excitation electrodes and at least a pair of extraction electrodes. The pair of extraction electrodes are respectively extracted from the pair of excitation electrodes to electrically and mechanically bond the pair of excitation electrodes to an external electrode. The pair of extraction electrodes each include a distal end portion. The distal end portion includes a connecting electrode extracted to a vicinity of one end portion on one principal surface of the piezoelectric resonator plate. The connecting electrodes each include a top surface where a first metal film to be bonded to the external electrode is formed. The first metal film includes a top surface with two or more protruding portions. The first metal film has a larger surface roughness and a smaller area compared with the respective connecting electrodes. The protruding portions are formed with cross-sections in curvature shapes.

3 Claims, 7 Drawing Sheets

(51) Int. Cl.
 *H03H 3/02* (2006.01)
 *H03H 9/13* (2006.01)
 *H03H 9/21* (2006.01)

(52) U.S. Cl.
 CPC .................. *H03H 9/17* (2013.01); *H03H 9/21*
 (2013.01); *H03H 2003/022* (2013.01)

(56) References Cited

U.S. PATENT DOCUMENTS

2010/0207696 A1\* 8/2010 Sayama ................ 331/158
2014/0210567 A1\* 7/2014 Koyama ................ 331/158

FOREIGN PATENT DOCUMENTS

| EP | 2187519 A1 | 5/2010 |
|---|---|---|
| JP | 6-338753 A | 12/1994 |
| JP | 2001-292048 A | 10/2001 |
| JP | 2004-289650 A | 10/2004 |
| JP | 2004-363936 A | 12/2004 |
| JP | 2007-288644 A | 11/2007 |
| JP | 2008-109538 A | 5/2008 |
| JP | 2010-81308 A | 4/2010 |
| JP | 2010-178064 A | 8/2010 |
| JP | 2010-178092 A | 8/2010 |
| JP | 2011-205421 A | 10/2011 |
| KR | 10-0204457 B | 6/1999 |

\* cited by examiner (a)

(b)

PIEZOELECTRIC RESONATOR PLATE, PIEZOELECTRIC RESONATOR, METHOD FOR MANUFACTURING PIEZOELECTRIC RESONATOR PLATE, AND METHOD FOR MANUFACTURING PIEZOELECTRIC RESONATOR

TECHNICAL FIELD

The present invention relates to a piezoelectric resonator plate used in, for example, an electronic device, a piezoelectric resonator including the piezoelectric resonator plate, and methods for manufacturing the piezoelectric resonator plate and the piezoelectric resonator.

BACKGROUND ART

A piezoelectric resonator device typified by a piezoelectric resonator is widely used in a mobile communication device such as a mobile phone. One of piezoelectric resonator plates used for the piezoelectric resonator is a crystal resonator plate. The crystal resonator plate includes excitation electrodes on front and back principal surfaces, extraction electrodes for extracting these excitation electrodes to end portions of the crystal resonator plate, and similar member. In this crystal resonator plate, a terminal electrode is formed inside of a box-shaped package with an open top, and a bonding portion (a connecting electrode) is formed in an end portion of the extraction electrode of the crystal resonator plate. The terminal electrode and the bonding portion are bonded together via a conductive bonding material. The opening portion is hermetically enclosed by a lid so as to constitute a surface-mount crystal resonator.

For example, in the crystal resonator disclosed in Patent Literature 1, a crystal resonator plate and the package are electrically and mechanically bonded together via the conductive bonding material such as a metal bump. To improve mutual bonding strength, the excitation electrode and the connecting electrode that are formed in the crystal resonator plate are different in material of a base electrode and a method for forming electrodes.

CITATION LIST

Patent Literature

PATENT LITERATURE 1: Japanese Unexamined Patent Application Publication No. 2004-104719

SUMMARY OF INVENTION

Technical Problem

However, the configuration in Patent Literature 1 does not only increase fabrication processes for forming the electrodes but also makes an electrode structure complicated. Consequently, this configuration not only increases costs but also is unsuitable for a downsized piezoelectric resonator that is preferred to have a simpler configuration. In the case where a plated bump is used as a metal bump, a top surface of the plated bump has a flat shape. Accordingly, use of an FCB method for ultrasonic bonding deforms and bonds a peripheral portion only of the top surface of the plated bump while a central region of the top surface of the plated bump is not bonded. This may degrade an effective area (efficiency) of bonding. To prevent these problems, for example, a condition for applying a stronger ultrasonic wave is used to bond a piezoelectric resonator plate inside of the package. In this case, a strong external force acts on the piezoelectric resonator plate. Accordingly, a new problem arises in that damage to the piezoelectric resonator plate is increased.

The present invention has been made in view of the above-described circumstances, and it is an object of the present invention to provide a piezoelectric resonator plate, a piezoelectric resonator, a method for manufacturing the piezoelectric resonator plate, and a method for manufacturing the piezoelectric resonator where a bonding structure of the piezoelectric resonator device that is lower-cost and effective for downsizing is obtained.

Solutions to the Problems

In order to achieve the above-described object, a piezoelectric resonator plate according to the present invention includes at least a pair of excitation electrodes and at least a pair of extraction electrodes. The pair of extraction electrodes are respectively extracted from the pair of excitation electrodes to electrically and mechanically bond the pair of excitation electrodes to an external electrode. The pair of extraction electrodes each include a distal end portion. The distal end portion include a connecting electrode extracted to a vicinity of one end portion on one principal surface of the piezoelectric resonator plate. The connecting electrodes each include a top surface where a first metal film to be bonded to the external electrode is formed. The first metal film includes a top surface with two or more protruding portions. The first metal film has a larger surface roughness and a smaller area compared with the respective connecting electrodes. The protruding portions are formed with cross-sections in curvature shapes.

With the present invention, a bonding structure of the piezoelectric resonator device (a piezoelectric resonator plate) that is lower-cost and effective for downsizing is obtained. That is, with the present invention, in bonding between an external electrode (such as a terminal electrode), which is formed on a substrate (a package) of an external member such as a piezoelectric resonator where the piezoelectric resonator plate is mounted, and the connecting electrode of the piezoelectric resonator plate, this allows bonding by the first metal film without using bonding material. As a result, in bonding of the connecting electrode of the piezoelectric resonator plate to a more downsized external electrode (such as a terminal electrode), position shifts and protrusions do not occur.

Additionally, with the present invention, the first metal films with larger surface roughnesses and smaller areas compared with the connecting electrodes are used to have the protruding portions with cross-sections in curvature shapes on the top surfaces of the first metal films. This ensures electrical and mechanical bonding of the first metal films to the external electrode in a more stable state. In bonding between the external electrode and the connecting electrode of the piezoelectric resonator plate, for example in the case where ultrasonic bonding is performed, the protruding portions with the cross-sections in curvature shapes facilitate deformation (crush). This ensures deformation (crush) with a smaller pressing force, thus improving bonding strength. Even if variation occurs in thickness between the pair of first metal films, the protruding portions absorb the variation to have balanced and stable bonding strength between the pair of connecting electrodes.

Additionally, the two or more protruding portions with the cross-sections in curvature shapes are formed on the top surface of the first metal films. Accordingly, the protruding portions can expand toward regions, which do not originally include the protruding portions of the top surface of the first metal films, on the top surface of the first metal films when the connecting electrode of the piezoelectric resonator plate is bonded to the external electrode. Accordingly, bonding every a plurality of the protruding portions to the external electrode improves bonding strength per unit area.

In bonding between the external electrode and the connecting electrode of the piezoelectric resonator plate, for example in the case where ultrasonic bonding is performed, the plurality of small protruding portions facilitates deformation (crush). This ensures deformation (crush) with a smaller pressing force for bonding. As a result, this eliminates damage on the piezoelectric resonator plate itself. Additionally, this simultaneously suppresses deformation of the protruding portions due to unnecessary protrusions from the top surface end portions of the first metal films. This reduces damages to the connecting electrodes or the first metal films of the piezoelectric resonator plate, or the external electrode along with ultrasonic bonding. Additionally, this thins a wiring pattern as the external electrode or narrows a pitch between wiring patterns corresponding to downsizing.

In the above-described configuration, the top surface of the first metal film may include two or more protruding portions along a top surface end portion of the first metal film excluding a center region on the top surface of the first metal film.

In this case, in addition to the above-described operation and effect, the protruding portions expand from the top surface end portions of the first metal films toward the center regions, which do not originally include the protruding portions, on the top surface of the first metal films when the connecting electrode of the piezoelectric resonator plate is bonded to the external electrode. Accordingly, bonding is performed to cover not only the top surface end portions of the first metal films but also the center regions. Accordingly, bonding every the plurality of protruding portions to the external electrode not only improves bonding strength per unit area, but also improves the bonding strength of the center regions on the top surface of the first metal film at the same time. That is, this improves not only bonding strength of the top surface end portions of the first metal films but also bonding strength of the center regions, thus dramatically improving total bonding strength of the first metal films with respect to the external electrode.

Additionally, along the top surface end portions of the first metal films, more of the protruding portions (not only two but three or more) are formed. This broadens the protruding portions uniformly balanced toward the center regions of the first metal films from the top surface end portion of the first metal films. This ensures bonding with higher stability and simultaneously improved strength with respect to the external electrode.

In the above-described configuration, a second metal film may be formed between the first metal film and the connecting electrode. The second metal film has a surface roughness larger than a surface roughness of the connecting electrode. The second metal film has a smaller area and a smaller thickness compared with the first metal film.

In this case, in addition to the above-described operation and effect, the thickness difference of the second metal films facilitates formation of the protruding portions with the cross-sections in curvature shapes on the top surfaces of the first metal films in the upper portion of the second metal films.

To the connecting electrodes with surface roughnesses not larger than those of the first metal films, the second metal films with thicknesses thinner than the first metal films are bonded. Bonding the first metal films to the second metal films improves bonding strength of the first metal films and the second metal films, thus ensuring stable bonding strength in the entire metal films (the first metal film and the second metal film). Preliminarily forming the second metal film allows stable formation of the first metal films independent from a material and similar parameter of the connecting electrodes. That is, the thinner second metal films are at least partially interposed between the first metal films and the connecting electrodes. This provides an anchor effect and improves strength compared with direct bonding of the first metal films to the connecting electrodes, thus ensuring more stable bonding.

Especially, in the case where ultrasonic bonding is performed in bonding between the external electrode and the connecting electrode of the piezoelectric resonator plate, if mutual bonding strength is low between metal films for bonding (the first metal films in the present invention) and the connecting electrodes, cracking may occur due to a mechanical stress between the metal films for bonding (the first metal films in the present invention) and the connecting electrodes when ultrasonic bonding is performed or when an impact such as dropping is applied after the bonding of the connecting electrodes. This may cause a trouble such as disconnection. However, in the present invention, such trouble does not occur.

In order to achieve the above-described object, a piezoelectric resonator according to the present invention includes the piezoelectric resonator plate according to the present invention that is bonded to a terminal electrode of a substrate. The terminal electrode is an external electrode.

With the present invention, a bonding structure of the piezoelectric resonator device (a piezoelectric resonator) that is lower-cost and effective for downsizing is obtained. That is, with the present invention, the above-described resonator plate is provided, thus ensuring the above-described operation and effect. Thus, the first metal film of the piezoelectric resonator plate that provides the above-described operation and effect is bonded to the terminal electrode of the substrate, thus ensuring electrical and mechanical improvement and stabilization of the bonding strength between the connecting electrode of the piezoelectric resonator plate and the terminal electrode of the substrate at the same time. As a result, this provides a piezoelectric resonator that is low-price, has a stable electrical characteristic and higher reliability, and is effective for downsizing.

In order to achieve the above-described object, a method for manufacturing a piezoelectric resonator plate according to the present invention is a method for manufacturing a piezoelectric resonator plate that includes at least a pair of excitation electrodes and at least a pair of extraction electrodes. The pair of extraction electrodes are respectively extracted from the pair of excitation electrodes to electrically and mechanically bond the pair of excitation electrodes to an external electrode. The extraction electrodes include connecting electrodes extracted to a vicinity of one end portion on one principal surface of a piezoelectric resonator plate. The method includes a first process, a second process, and a third process. The first process forms the excitation electrodes and the extraction electrodes on the piezoelectric resonator plate by a vapor deposition method or a sputtering method. The second process forms two or more second metal films on a top surface of the connecting electrode by a plating method. The second metal film has an area smaller than an area of the connecting electrode. The third process forms a first metal film on the top surface of the connecting electrode including a top surface of the second metal film. The first metal film has a larger area and a larger thickness compared with the second metal film.

The first metal film is formed on the top surface of the second metal film by a plating method such that the two or more second metal films are arranged in a region excluding a center region of the first metal film.

With the present invention, a bonding structure of the piezoelectric resonator device (a piezoelectric resonator plate) that is lower-cost and effective for downsizing is obtained. That is, the present invention facilitates forming of the first metal films and the second metal films that have surface roughnesses larger than those of the connecting electrodes. Regarding the thin second metal films, this allows stable forming of plated films in the upper portion of the connecting electrodes. Even in the case of the thick first metal films, forming the first metal films in the upper portion of the second metal films with rough surfaces suppresses influence of a difference in growth speed of the plated films at the boundary between the films, thus ensuring stable grow of the plated films. Additionally, forming the first metal film that has a larger area and a larger thickness compared with the second metal film easily provides a curved shape of the protruding portion.

In the third process, on the top surface of the first metal films, the two or more protruding portions are formed along the top surface end portions of the first metal films excluding the center regions on the top surface of the first metal films. The second metal films forms asperities (thickness differences) on the connecting electrodes. This easily forms the protruding portions with the cross-sections in curvature shapes on the top surfaces of the first metal films. The first metal films and the second metal films are formed by a batch process without generating mechanical stress loading on the piezoelectric resonator plate. This allows lower-cost fabrication of the piezoelectric resonator plate, thus providing extremely high degree of freedom for designing surface areas, shapes, and thicknesses. The piezoelectric resonator plate constituted by the fabrication method according to the present invention provides operation and effect similar to those of the piezoelectric resonator plate according to the present invention described above.

In order to achieve the above-described object, a method for manufacturing a piezoelectric resonator according to the present invention is a method for manufacturing a piezoelectric resonator that includes the piezoelectric resonator plate according to the present invention. The piezoelectric resonator plate is bonded to a terminal electrode of a substrate. The terminal electrode is an external electrode. The first metal film of the piezoelectric resonator plate that is formed through the first process to the third process is bonded to the terminal electrode by ultrasonic bonding.

With the present invention, a bonding structure of the piezoelectric resonator device (a piezoelectric resonator) that is lower-cost and effective for downsizing is obtained. That is, with the present invention, in addition to the above-described operation and effect, the protruding portion stably formed as described above allows more stable ultrasonic bonding. This allows more stable thermal diffusion bonding of the first metal film to the external electrode. Additionally, this allows more stable electrical and mechanical bonding. The protruding portion facilitates deformation (crush) of the protruding portion when ultrasonic bonding is performed. This ensures deformation (crush) with a smaller pressing force, thus improving bonding strength. As a result, this eliminates damage to peripheral members such as the external electrode and the connecting electrode.

Advantageous Effects of Invention

As described above, with the piezoelectric resonator plate, the piezoelectric resonator, the method for manufacturing the piezoelectric resonator plate, and the method for manufacturing the piezoelectric resonator according to the present invention, the bonding structure of the piezoelectric resonator device (the piezoelectric resonator plate and the piezoelectric resonator) that is lower-price and effective for downsizing is obtained.

DESCRIPTION OF EMBODIMENTS

Figure 1:
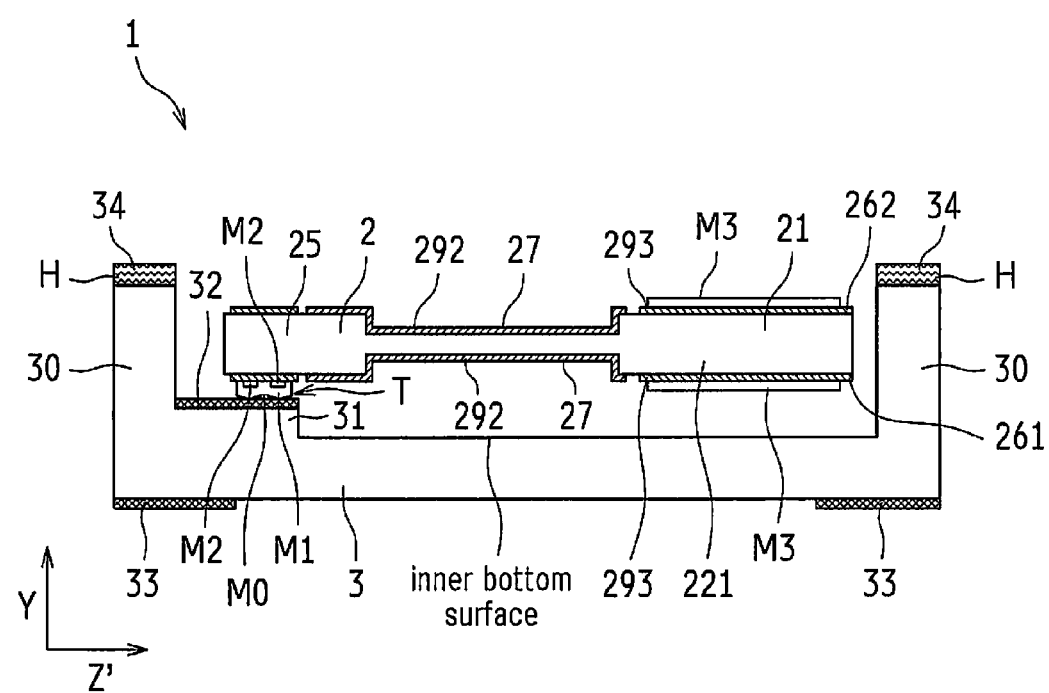
FIG. 1 is a schematic cross-sectional view of a tuning-fork type crystal resonator illustrating an embodiment of the present invention.

Hereinafter, an exemplary piezoelectric resonator plate of a tuning-fork type crystal resonator will be described by referring to the accompanying drawings. In a tuning-fork type crystal resonator 1 used in this embodiment, a base 3 and a lid (not shown) are bonded together via a sealing member H to constitute a housing. Specifically, in this configuration, an electrode pad 32 of the base 3 with an open top is bonded to a tuning-fork type crystal resonator plate 2 via a first metal film M1 such as a plated bump. The opening portion (opening) of the base 3 has an end surface that is bonded to a plate-shaped lid via the sealing member H so as to seal the opening of the base 3. Here, in this embodiment, the tuning-fork type crystal resonator 1 has a nominal frequency of 32.768 kHz. This nominal frequency is one example, and may employ another frequency.

The base 3 is an insulation container formed of ceramic material or glass material. In this embodiment, for example, the base 3 is formed of ceramic material by calcination. The base 3 includes a dike portion 30 in a peripheral area, and has a depressed shape with an open top in a cross-sectional view. Inside (housing space) of the base 3, a level difference portion 31 is formed for mounting the tuning-fork type crystal resonator plate 2. On a top surface of the level difference portion 31, a pair of electrode pads 32 (in FIG. 1, only one electrode pad 32 is illustrated) is formed. The pair of electrode pads 32 is electrically coupled to two or more terminal electrodes 33 via a wiring pattern (not shown) formed inside of the base 3. The terminal electrodes 33 are formed on a bottom surface (a back surface) of the base 3. In a peripheral area of the dike portion 30 of the base 3, a metallized layer 34 (constituting a part of the sealing member H) is formed in an enclosed shape. The electrode pad 32, the terminal electrode 33, and the metallized layers 34 are each constituted by, for example, three layers. From the lower layer, tungsten, nickel, and gold are laminated in this order. Tungsten is integrally formed by a metallizing technique when ceramic is fired. Each layer of nickel and gold is formed by a plating technique. Here, the tungsten layer may employ molybdenum.

The lid (not shown) is formed by, for example, metallic material, ceramic material, and glass material, and has a shape of one rectangular plate in plan view. On an inferior surface of this lid, a sealing film (constituting a part of the sealing member H) is formed. This lid is bonded to the base 3 via the sealing material by seam welding, beam welding, thermal fusion bonding, and similar method so as to constitute the housing of the crystal resonator 1 using the lid and the base 3.

While the tuning-fork type crystal resonator plate 2 is not shown, the tuning-fork type crystal resonator plate 2 is formed of one crystal wafer that is formed of a Z-plate crystal. The Z-plate crystal is an anisotropic material that has crystal orientations in the X axis direction, the Y axis direction, and the Z' axis direction. The tuning-fork type crystal resonator plate 2 has an outline that is collectively formed using photolithography technology, for example, by wet etching using resist or a metal film as masks.

Figure 2:
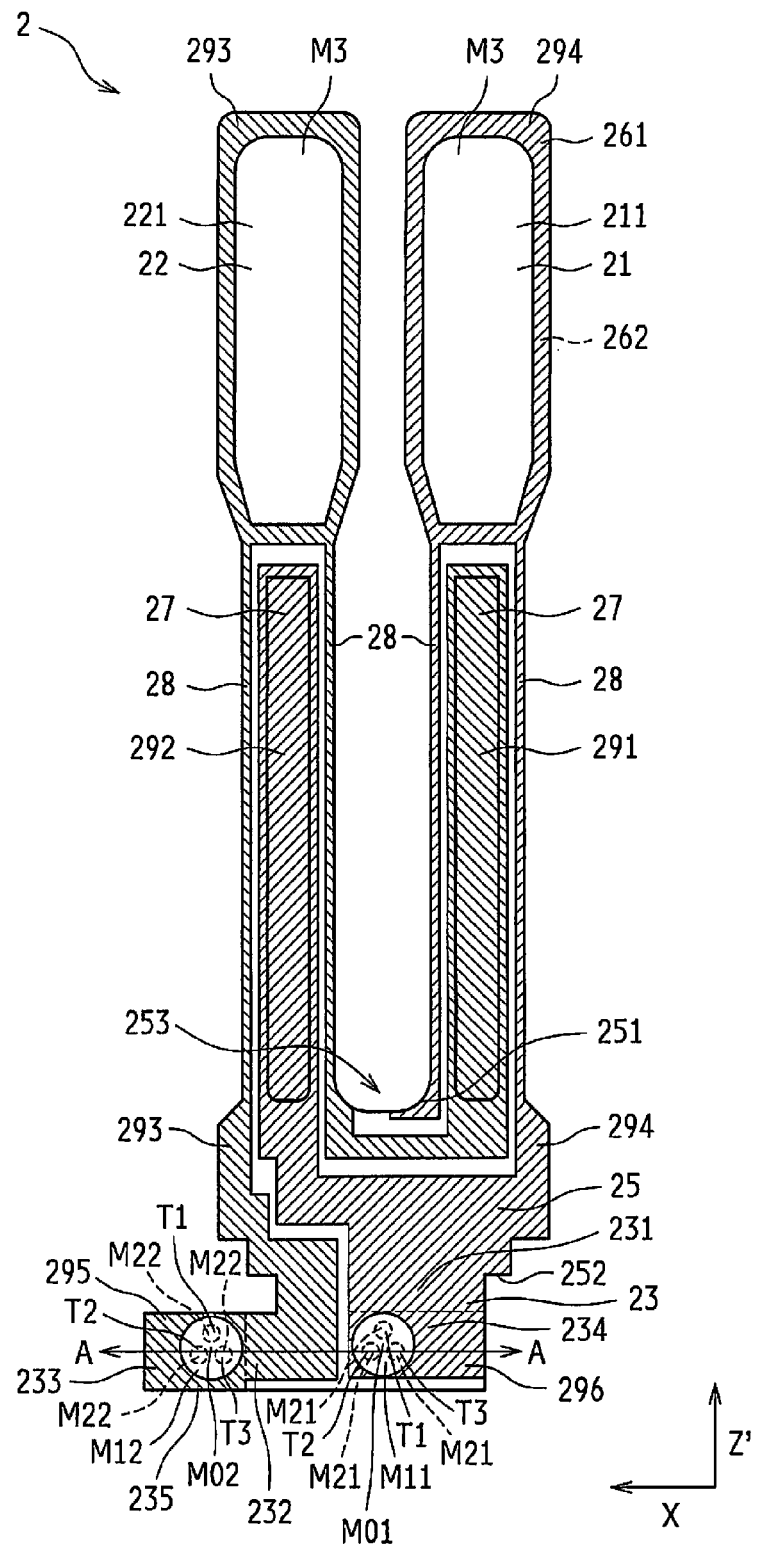
FIG. 2 is a plan view of one principal surface side of a tuning-fork type crystal resonator plate illustrating the embodiment of the present invention.

The tuning-fork type crystal resonator plate 2 has an outline formed by, as illustrated in FIG. 2, two leg portions of a first leg portion 21 and a second leg portion 22 as a vibrator, a bonding portion 23 bonded to outside (the electrode pad 32 of the base 3 in this embodiment), and a base portion 25 that includes the first leg portion 21, the second leg portion 22, and the bonding portion 23 that each protrude.

The base portion 25 has a laterally symmetrical shape in plan view, and as illustrated in FIG. 2, formed broader than the vibrator (the first leg portion 21 and the second leg portion 22). The vicinity of the other end surface 252 of the base portion 25 has gradual level differences such that the width becomes narrow from one end surface 251 to the other end surface 252. Thus, the other end surface 252 attenuates leakage vibration generated by vibration of the first leg portion 21 and the second leg portion 22 that form the vibrator. This suppresses transmission of the leakage vibration to the bonding portion 23. This is preferred to further reduce sound leakage (vibration leakage). In the vicinity of the other end surface 252 of the base portion 25, the configuration that gradually becomes narrow is not limited to the shape of level differences and may be a tapered shape or a curved surface shape.

Two of the first leg portion 21 and the second leg portion 22, as illustrated in FIG. 2, protrudes from the one end surface 251 of the base portion 25, and arranged via a gap portion 253. Here, the gap portion 253 is disposed in the central position (the central region) in a width direction of the one end surface 251. In these first leg portion 21 and second leg portion 22, distal end portions 211 and 221 are formed broader than other portions (other than a portion at the base portion 25 side of the first leg portion 21 and the second leg portion 22) of the first leg portion 21 and the second leg portion 22 in a direction perpendicular to the protruding direction (hereinafter referred to as a broader region of leg portion). Further, respective corner portions are formed with curved surfaces. Thus, forming the distal end portions 211 and 221 broader effectively uses the distal end portions 211 and 221 (distal end regions). This is effective for downsizing the tuning-fork type crystal resonator plate 2 and also effective for providing lower frequency vibration. Forming the respective corner portions of the distal end portions 211 and 221 with curved surfaces prevents a contact with the dike portion and similar portion, for example, when the respective corner portions receive external forces.

On one principal surface 261 and the other principal surface 262 in two of the first leg portion 21 and the second leg portion 22, groove portions 27 are each formed to improve a series resonance resistance value (a CI value in this embodiment, same below) that is degraded due to downsizing of the tuning-fork type crystal resonator plate 2. In the outline of the tuning-fork type crystal resonator plate 2, a part of side surfaces 28 is formed to be inclined with respect to the one principal surface 261 and the other principal surface 262. This is because when the tuning-fork type crystal resonator plate 2 is formed by wet etching, the etching rate of a substrate material in the crystal orientations (the X-direction and the Y-direction illustrated in FIG. 2) is varied.

As illustrated in FIG. 2, the bonding portion 23 is for electrically and mechanically bonding extraction electrodes 293 and 294 described below to the external electrode (which is called outside in the present invention, and the electrode pad 32 of the base 3 in this embodiment). Specifically, the bonding portion 23 is formed to protrude from the central position (the central region) in the width direction of the other end surface 252 that faces the one end surface 251 of the base portion 25 where two of the first leg portion 21 and the second leg portion 22 protrude. That is, the bonding portion 23 protrudes in a position facing the gap portion 253 disposed between two of the first leg portion 21 and the second leg portion 22.

The bonding portion 23 includes a short side portion 231 and a long side portion 232. The short side portion 231 protrudes toward the other end surface 252 of the base portion 25 in a vertical direction in plan view, and is narrower than the other end surface 252. The long side portion 232 is continuous with the distal end portion of the short side portion 231, and extends in a width direction of the base portion 25 by bending orthogonally in plan view in the distal end portion of the short side portion 231. A distal end portion 233 of the bonding portion 23 faces the width direction of the base portion 25. That is, the bonding portion 23 is formed in an L shape in plan view. A folded portion 234, which is a folded portion formed in an L shape in plan view, corresponds to the distal end portion of the short side portion 231. Accordingly, the short side portion 231 is formed narrower than the other end surface 252 of the base portion 25, thus improving the effect for suppressing vibration leakage.

In this embodiment, the folded portion 234 of the short side portion 231 corresponding to a base end portion of the bonding portion 23 is assumed to be a bonding region to be bonded to the outside. The distal end portion of the long side portion 232 corresponding to the distal end portion 233 of the bonding portion 23 is assumed to be a bonding region to be bonded to the outside. In the short side portion 231, which is the base end portion of the bonding portion 23, the extraction electrode 294 (the connecting electrode in the present invention) described below is formed. The extraction electrode 294 is extracted from a second excitation electrode 292 to the end portion (the one end portion) of the short side portion 231. In the long side portion 232, which is the distal end portion of the bonding portion, the extraction electrode 293 (the connecting electrode in the present invention) described below is formed. The extraction electrode 293 is extracted from a first excitation electrode 291 to the end portion (the one end portion) of the long side portion 232.

In the tuning-fork type crystal resonator plate 2 according to this embodiment, two of the first excitation electrode 291 and the second excitation electrode 292 at different electric potentials, the extraction electrodes 293 and 294, and connecting electrodes 295 and 296 are integrally formed at the same time. The extraction electrodes 293 and 294 are extracted from the first excitation electrode 291 and the second excitation electrode 292 to electrically couple the first excitation electrode 291 and the second excitation electrode 292 to the electrode pad 32. The connecting electrodes 295 and 296 include respective distal end portions where metal films (a first metal film M1 and a second metal film M2) described below are formed. Here, the two extraction electrodes 293 and 294 in this embodiment are respective electrode patterns that are extracted from two of the first excitation electrode 291 and the second excitation electrode 292. The connecting electrodes 295 and 296 are formed in bonding portions with the base 3 in leading ends of the extraction electrodes 293 and 294.

A part of two of the first excitation electrode 291 and the second excitation electrode 292 is formed inside of the groove portions 27. Accordingly, even in the case where the tuning-fork type crystal resonator plate 2 is downsized, this suppresses oscillation loss of the first leg portion 21 and the second leg portion 22, thus reducing the CI value.

The first excitation electrode 291 is formed on both the principal surfaces (the one principal surface 261 and the other principal surface 262) of the first leg portion 21 and both the side surfaces 28 of the second leg portion 22. Similarly, the second excitation electrode 292 is formed on both the principal surfaces (the one principal surface 261 and the other principal surface 262) of the second leg portion 22 and both the side surfaces 28 of the first leg portion 21.

Next, a method for manufacturing the tuning-fork type crystal resonator plate 2 will be described.

One crystal wafer formed of the Z-plate crystal that is an anisotropic material with the crystal orientations in the X axis direction, the Y axis direction, and the Z' axis direction is used to collectively form a large number of tuning-fork type crystal resonator plates 2 in a matrix with the crystal wafer. At this time, the outlines of the tuning-fork type crystal resonator plates 2 are collectively formed using photolithography technology, for example, by wet etching using resists or metal films as masks.

Subsequently, simultaneously with the formation of the outlines of the tuning-fork type crystal resonator plates 2, the first excitation electrode 291, the second excitation electrode 292, the extraction electrodes 293 and 294, and the connecting electrodes 295 and 296 are formed. In this embodiment, the first excitation electrode 291, the second excitation electrode 292, the extraction electrodes 293 and 294, and the connecting electrodes 295 and 296 are formed through a first process, a second process, and a third process in this order as follows.

First Process

The first excitation electrode 291, the second excitation electrode 292, the extraction electrodes 293 and 294, and the connecting electrodes 295 and 296 of the tuning-fork type crystal resonator plate 2 described above are thin films. These thin films are formed such that respective chromium (Cr) layers on the first leg portion 21 and the second leg portion 22 are formed by metal vapor deposition and gold (Au) layers are formed on these chromium layers. These thin films are formed on an entire surface of the substrate by a method such as a vacuum vapor deposition method and a sputtering method. Subsequently, metal etching is performed by a photolithography method to form thin films in desired shapes. Thus, the thin films are integrally formed at the same time. The first excitation electrode 291, the second excitation electrode 292, and the extraction electrodes 293 and 294 are formed with chrome (Cr) and gold (Au) in this order. However, for example, an order of chrome (Cr) and silver (Ag), an order of chrome (Cr), gold (Au), and chrome (Cr), or an order of chrome (Cr), silver (Ag), and chrome (Cr) may be possible. A plurality of films may be laminated, for example, chrome (Cr), gold (Au), chrome (Cr), and gold (Au) in this order. The foundation layer of chrome (Cr) may be a nichrome made of alloy of nickel (Ni), titanium (Ti), and chrome (Cr).

On the one principal surfaces 261 and the other principal surfaces 262 of the respective distal end portions 211 and 221 in the first leg portion 21 and the second leg portion 22, the respective extraction electrodes 293 and 294 are formed on almost entire surfaces of the respective broader regions in the first leg portion 21 and the second leg portion 22 described above.

In portions corresponding to the bonding portions with the base 3 on the top surfaces of the extraction electrodes 293 and 294 formed on one principal surface 235 of the bonding portion 23, first metal films M1 (M11 and M12) are formed. The first metal films M1 have larger surface roughness and smaller areas than those of the connecting electrodes 295 and 296. The first metal films M1 (M11 and M12) have circular shapes in plan view.

Figure 4:
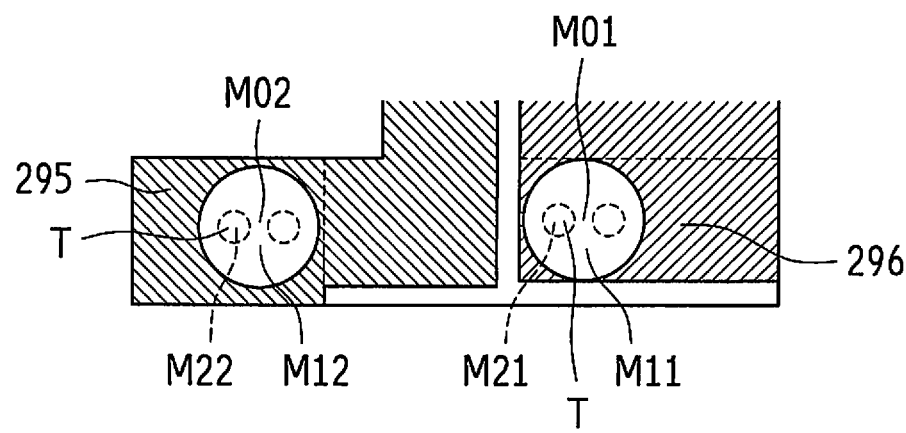
FIGS. 4A and 4B are partially enlarged plan views of a modification of the embodiment of the present invention.
Figure 4:
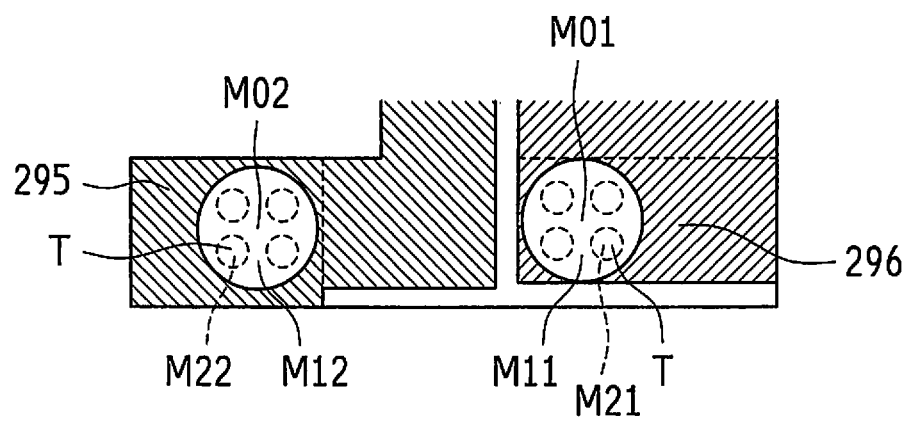

These first metal films M1 (M11 and M12) have top surfaces where two or more protruding portions T are disposed along the top surface end portions of the first metal films M1 excluding the center regions M0 (M01 and M02) on the top surfaces of the first metal films M1. In this embodiment, for example, three protruding portions T (T1, T2, and T3) have shapes of circles in plan view. Along the top surface end portions of the first metal films M1, more of the protruding portions T1, T2, and T3 are formed. This broadens the protruding portions T1, T2, and T3 uniformly balanced toward the center regions M0 (M01 and M02) of the first metal films M1 from the top surface end portion of the first metal films M1. This provides higher stability with respect to the electrode pads 32 (only one electrode pad 32 is illustrated in FIG. 1) after diffusion bonding, and simultaneously improves strength. This effect is improved by the three or more protruding portions T, and increasing the number, for example, to four or five further improves this effect. Here, as a configuration of the protruding portions T that facilitates fabrication when the protruding portion T is produced and effectively improves bonding strength in a state where the protruding portions T do not interfere with one another, around three or four protruding portions T are preferred. FIG. 4 (FIG. 4A and FIG. 4B) illustrate a plurality of protruding portions T. Specifically, FIG. 4A illustrates an embodiment where two protruding portions T are formed. FIG. 4B illustrates an embodiment where four protruding portions T are formed. In the embodiments illustrated in FIG. 2 and FIGS. 4A and 4B, all the protruding portions T of the first metal film M11 and the protruding portions T of the first metal film M12 have the same size. This should not be construed in a limiting sense. One protruding portion T may be larger than the other protruding portions T. For example, the protruding portions T of the first metal film M11 may have larger sizes than those of the protruding portions T of the first metal film M12. In this case, bonding strength of total bonding is improved when the tuning-fork type crystal resonator plate 2 is bonded to the base 3. That is, bonding in the first metal film (the first metal film M12 in this embodiment) at a side closer to the base portion 25 significantly affects the bonding strength where the tuning-fork type crystal resonator plate 2 is bonded to the base 3 and improves bonding strength in this portion so as to improve the bonding strength of total bonding when the tuning-fork type crystal resonator plate 2 is bonded to the base 3.

Specifically, on the first metal film M11, a second metal film M21 is formed. The second metal film M21 is disposed on the top surface of the connecting electrode 296 in the folded portion 234 on the one principal surface 235 of the bonding portion 23, and formed of the same material as that of the first metal film M11. The second metal film M21 has an area smaller than that of the first metal film M11, has an area smaller than that of the connecting electrode 296, and has a thickness thinner than that of the first metal film M11. This second metal film M21 is formed in a circular shape in plan view, and is formed such that the three protruding portions T1, T2, and T3 are interposed along the top surface end portion of the first metal film M1 in a forming region of the first metal film M1 excluding the center region M01. On the first metal film M12, a second metal film M22 is formed. The second metal film M22 is disposed on the top surface of the connecting electrode 295 in the distal end portion 233 on the one principal surface 235 of the bonding portion 23, and formed of the same material as that of the first metal film M12, has an area smaller than that of the first metal film M12. The second metal film M22 has an area smaller than that of the connecting electrode 295, and has a thickness thinner than that of the first metal film M12. This second metal film M22 is formed in a circular shape in plan view, and is formed such that the three protruding portion T1, T2, and T3 are interposed along the top surface end portion of the first metal film M1 in a forming region of the first metal film M1 excluding the center region M02.

Figure 3:
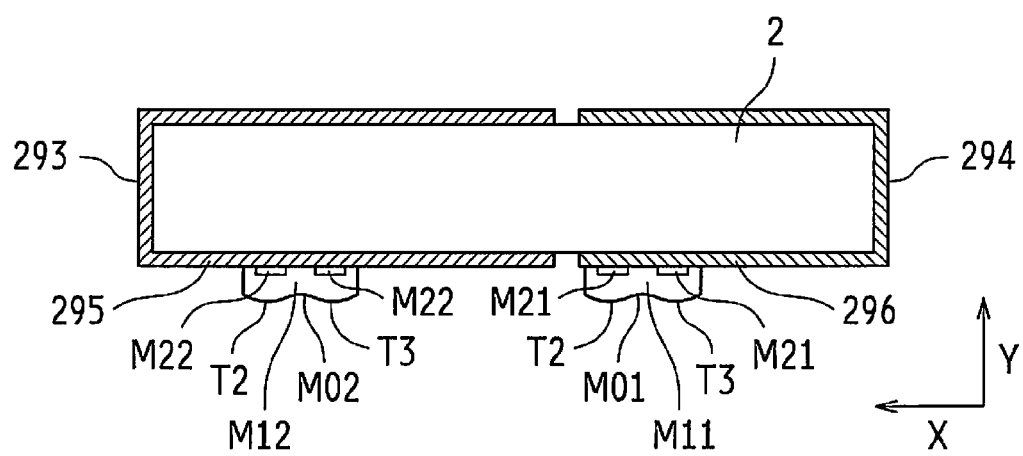
FIG. 3 is a cross-sectional view taken along the line A-A of FIG. 2.
Figure 5:
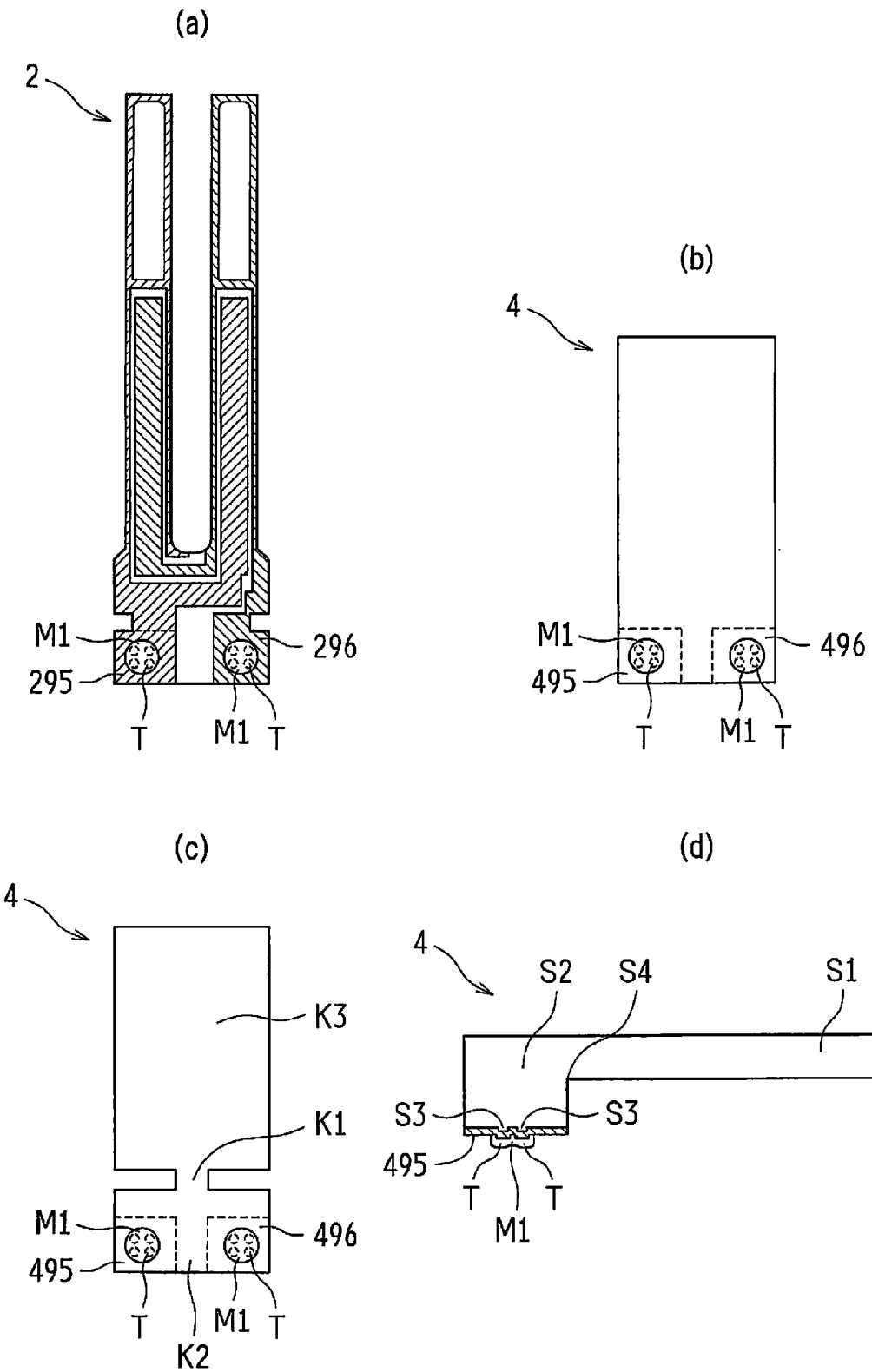
FIGS. 5A to 5D are views illustrating another embodiment of the present invention.

The protruding portions T have cross-sectional shapes formed of an arc shape (hereinafter referred to as a curved shape) with curvature as illustrated in FIG. 3 (a semielliptical shape in this embodiment). In the case where these protruding portions T are formed in the curved shapes (the arc shapes), any configuration is possible insofar as at least the leading ends of the protruding portions T have curved surfaces. It is preferred that the protruding portions T have the entire surface as a curved surface (a semicircular shape or a semielliptical shape) to further improve bonding strength and stability. These protruding portions T are constituted by forming the second metal films M2 (M21 and M22) between the first metal films M1 (M11 and M12) and the connecting electrodes 295 and 296. The second metal films M2 have surface roughnesses larger than those of the connecting electrodes 295 and 296, are formed of the same material as that of the first metal films M1 (M11 and M12), and have smaller areas and smaller thicknesses than the first metal films M1 (M11 and M12). Similarly to this embodiment, the protruding portions T are not limited to the following configuration. The metal films (the first metal film M1 and the second metal film M2) with two or more layers are laminated to constitute the protruding portions T with cross-sections in curvature shapes. For example, configurations illustrated in FIGS. 5A to 5D may be possible. FIG. 5 includes FIG. 5A, FIG. 5B, FIG. 5C, and FIG. 5D. FIG. 5A illustrates a schematic plan view of the tuning-fork type crystal resonator plate 2. FIGS. 5B and 5C illustrate schematic plan views of, for example, an AT-cut crystal resonator plate 4. FIG. 5D illustrates a schematic cross-sectional view of, for example, the AT-cut crystal resonator plate 4. Especially, as illustrated in FIG. 5D, four protruding portions S3 (two protruding portions S3 are illustrated in the drawing) are formed in a portion of the base material of the crystal resonator plate 4. This forming of the protruding portion S3 also constitutes the protruding portions T with the cross-sectional shapes in curvature shapes with the first metal film M1 alone.

With the above-described embodiment illustrated in FIGS. 5A to 5D, the protruding portions T (T1, T2, and T3) with the cross-sectionals in curvature shapes are simply constituted on the top surfaces of the first metal films M1 (M11 and M12), which are disposed in the upper portion of the second metal films M2 (M21 and M22), by the thickness differences of the second metal films M2 (M21 and M22).

The second metal films M2 (M21 and M22) are formed in sizes (thicknesses) twice to 20 times larger than the thicknesses of the first metal films M1 (M11 and M12). For example, the second metal films M2 (M21 and M22) are formed with thicknesses of around 1 to 2 μm. The first metal films M1 (M11 and M12) are formed with thicknesses of around 4 to 20 μm. After ultrasonic bonding (after FCB), at least the first metal films M1 (M11 and M12) are crushed and extend in a surface direction to have approximately half thicknesses. In the case where the thicknesses of the first metal films M1 (M11 and M12) are smaller than 4 μm, the gap between the connecting electrodes 295 and 296 of the tuning-fork type crystal resonator plate 2 and the electrode pad 32 of the base 3 become smaller. This easily causes a negative effect on electrical characteristics of the tuning-fork type crystal resonator 1. In the case where the thicknesses of the first metal films M1 (M11 and M12) are larger than 20 μm, influences of gradients and position shifts of the tuning-fork type crystal resonator plate 2 easily occur, thus easily causing variation in bonding strength. Here, the shapes in plan view of the first metal films M1 (M11 and M12) as plated bumps and the shapes in plan view of the second metal films M2 (M21 and M22) as intermediate plated bumps are circular shapes as an example. However, for example, oval shapes and similar shape with different curvature shapes and polygonal shapes including rectangular shapes and square shapes may be freely constituted corresponding to the shapes in plan view of the connecting electrodes or similar member.

Second Process

Regarding formation of the first metal films M1 (M11 and M12) and the second metal films M2 (M21 and M22) to the bonding portion 23, a forming portion (a mask that has window portions with areas smaller than those of the connecting electrodes 295 and 296) (not shown) for the second metal films M2 (M21 and M22) is formed in the respective regions (the top surfaces of the connecting electrodes 295 and 296) of the bonding portion 23 by a photolithography method to have a desired shape (a window portion in a rectangular shape in this embodiment). Subsequently, in the forming portion of the second metal films M2 (M21 and M22), the second metal films M2 (M21 and M22) are formed by plating, for example, using a method such as an electrolytic plating method.

Third Process

In the respective regions (the top surfaces of the second metal film M2) of the second metal films M2 (M21 and M22), a forming portion (a mask that has window portions with areas that are smaller than those of the connecting electrodes 295 and 296 and larger than those of the second metal films M2) (not shown) of the first metal films M1 (M11 and M12) is formed by a photolithography method in a desired shape (a window portion in a circular shape in this embodiment). Subsequently, in the forming portion of the first metal films M1 (M11 and M12), the first metal films M1 (M11 and M12) are formed by plating, for example, using a method such as an electrolytic plating method. Subsequently, an annealing process may be performed.

On the top surfaces of the extraction electrodes 293 and 294 formed in the broader regions on the one principal surfaces 261 of the first leg portion 21 and the second leg portion 22, as illustrated in FIG. 2, an adjustment metal film (a frequency adjustment weight) M3 is integrally formed with an area slightly smaller than those of the extraction electrodes 293 and 294 such that the mass of the metal film is reduced by beam irradiation with, for example, a laser beam to adjust the frequency of the tuning-fork type crystal resonator plate 2. The adjustment metal film M3 is formed as follows. For example, on the extraction electrodes 293 and 294 formed in the respective broader regions, a forming portion (a desired shape) of the adjustment metal film M3 is formed by a photolithography method. In the forming portion of the adjustment metal film M3, the adjustment metal film M3 is formed by plating, for example, using a method such as an electrolytic plating method. After this forming by plating, an annealing process may be performed. When these metal films such as the adjustment metal film M3 are formed by plating, the adjustment metal film M3 is practically preferred to be simultaneously constituted in the same process with at least one of the first metal films M1 (M11 and M12) and the second metal films M2 (M21 and M22) described-above. The first metal films M1 (M11 and M12), the second metal films M2 (M21 and M22), and the adjustment metal film M3 are formed of the same material such as gold (Au).

In the tuning-fork type crystal resonator plate 2 configured as described above, frequencies of the respective tuning-fork type crystal resonator plates 2 in a wafer state are measured. Subsequently, the respective adjustment metal films M3 of the tuning-fork type crystal resonator plates 2 are, for example, reduced by beam irradiation or increased by partial vapor deposition to perform coarse adjustment of the frequencies.

After the coarse adjustment of the frequencies is performed, individual tuning-fork type crystal resonator plates 2 are taken out from the wafer. Regarding these tuning-fork type crystal resonator plates 2, the first metal films M1 (M11 and M12) formed on the top surfaces of the connecting electrodes 295 and 296 at the one principal surface 261 side are bonded to the electrode pad 32 of the base 3 by ultrasonic bonding using the FCB method. Thus, the tuning-fork type crystal resonator plates 2 are mounted on the base 3. When the tuning-fork type crystal resonator plate 2 is mounted on the base 3, ashing is performed on a mounting portion and similar portion of the base 3 to activate a bonding interface (such as the first metal film MD between the tuning-fork type crystal resonator plate 2 and the base 3. The ashing process may be performed in a wafer state. Subsequently, in a state where the bonding portion is activated, the tuning-fork type crystal resonator plate 2 is bonded to the base 3 by applying pressure to crush a part (the protruding portions T) of the first metal film M1. At this time, with respect to the bottom surface inside of the housing in the base 3, the principal surface of the tuning-fork type crystal resonator plate 2 is disposed to face the same direction, or the principal surface of the tuning-fork type crystal resonator plate 2 is inclined. Thus, bonding by applying pressure to crush the protruding portions T suppresses excessive diffusion of the material that constitutes the first metal M1 due to the bonding. This effect relates to the metal films such as the first metal films M1 formed by plating. The protruding portions T are crushed during the bonding. This reduces excessive diffusion and damage that are generated in the metal films such as the first metal films M1. This consequently suppresses film delamination due to impact, for example, when the crystal resonator 1 is dropped. Additionally, this method for forming these films stably crushes metal films even if the metal films are formed by plating.

The frequency of the tuning-fork type crystal resonator plate 2 mounted on the base 3 is measured again. Subsequently, based on the measurement result, the adjustment metal film M3 of the tuning-fork type crystal resonator plate 2 is reduced by beam irradiation, ion milling, or similar method to perform a final adjustment of the frequency with fine adjustment of the frequency.

Subsequently, to the base 3 with the tuning-fork type crystal resonator plate 2 on which the final adjustment of the frequency is performed, a lid (not shown) is bonded via the sealing member H by a method such as thermal fusion bonding. The tuning-fork type crystal resonator plate 2 is hermetically enclosed inside of the housing constituted by the base 3 and the lid (not shown). The above-described method for hermetic enclosing may employ seam welding, beam welding, atmosphere heating and similar method.

With the above-described configuration, in the tuning-fork type crystal resonator 1 where the tuning-fork type crystal resonator plate 2 according to this embodiment is provided, use of the plated bumps of the first metal films M1 (M11 and M12) as the bonding material eliminates position shifts and protrusions with respect to the more downsized electrode pad 32 and the connecting electrodes 295 and 296. Additionally, the first metal films M1 (M11 and M12) electrically and mechanically bonds the tuning-fork type crystal resonator plate 2 on the base 3 in a stable state. Specifically, use of the plated bumps of the first metal films M1 (M11 and M12) allows formation of the plated bumps of the first metal films M1 (M11 and M12) in the tuning-fork type crystal resonator plate 2 before the tuning-fork type crystal resonator plate 2 is mounted to the outside (the base 3). Consequently, the plated bumps of the first metal films M1 (M11 and M12) are always formed in the desired forming position. For example, even in the case where the mounting position of the tuning-fork type crystal resonator plate 2 to the outside (the base 3) is displaced off the desired position, this prevents the tuning-fork type crystal resonator plate 2 from being mounted on the outside (the base 3) in a state with displaced bumps. This allows stable mounting of the tuning-fork type crystal resonator plate 2 on the base 3.

Additionally, the first metal films M1 (M11 and M12) with larger surface roughnesses and smaller areas than the connecting electrodes 295 and 296 are used. This bonds the first metal films M1 (M11 and M12) to the electrode pad 32 by thermal diffusion bonding in a more stable state, thus stabilizing electrical and mechanical bonding. The thickness differences of the second metal films M2 (M21 and M22) facilitates configuration of the protruding portions T (T1, T2, and T3) with cross-sections in curvature shapes on the top surfaces of the first metal films M1 (M11 and M12). These protruding portions T (T1, T2, and T3) in the curvature shapes facilitates deformation (crush) of the protruding portions T (T1, T2, and T3) when ultrasonic bonding is performed. This ensures deformation (crush) with a smaller pressing force, thus improving bonding strength. Additionally, this eliminates damage to the tuning-fork type crystal resonator plate 2 itself. Even in the case where variation occurs in thickness between the first metal film M11 and the first metal film M12, the protruding portions T (T1, T2, and T3) absorb the variation to have balanced and stable bonding strength between the connecting electrode 295 and the connecting electrode 296.

Additionally, the two or more protruding portions T (T1, T2, and T3) with the cross-sections in curvature shapes are formed along the top surface end portions of the first metal films M1 (M11 and M12) excluding the center regions M0 (M01 and M02) on the top surface of the first metal films M1 (M11 and M12). Accordingly, the protruding portions T (T1, T2, and T3) that are deformed when the tuning-fork type crystal resonator plate 2 is bonded to the base 3 by ultrasonic bonding can expand from the top surface end portions of the first metal films M1 (M11 and M12) toward the center regions M0 (M01 and M02), which do not originally include the protruding portions T (T1, T2, and T3), on the top surface of the first metal films M1 (M11 and M12). After the deformation, diffusion bonding is performed to cover not only the top surface end portions of the first metal films M1 (M11 and M12) but also the center regions M0 (M01 and M02). Accordingly, this also improves bonding strength of the center regions M0 (M01 and M02) on the top surface of the first metal films M1 (M11 and M12). That is, this improves not only bonding strength of the top surface end portions of the first metal films M1 (M11 and M12) but also bonding strength of the center regions M0 (M01 and M02), thus dramatically improving total bonding strength of the first metal films M1 (M11 and M12) with respect to the electrode pad 32. Especially, in the case where the piezoelectric resonator plate is the tuning-fork type crystal resonator plate 2, the configuration improves not only bonding strength of the top surface end portion of the first metal films M1 (M11 and M12) but also bonding strength of the center regions M0 (M01 and M02) when the connecting electrodes 295 and 296 of the tuning-fork type crystal resonator plate 2 is electrically and mechanically bonded to the electrode pad 32 of the base 3. This dramatically reduces occurrence of vibration leakage (sound leakage), thus eliminating degradation of the electrical characteristic of the tuning-fork type crystal resonator 1.

Additionally, this simultaneously suppresses deformation of the protruding portions T (T1, T2, and T3) due to unnecessary protrusions from the top surface end portions of the first metal films M1 (M11 and M12). This is less likely to damage the connecting electrodes 295 and 296 or the first metal films M1 (M11 and M12) of the tuning-fork type crystal resonator plate 2, or the electrode pad 32 (partially illustrated) along with ultrasonic bonding.

To the connecting electrodes 295 and 296 with surface roughnesses not larger than those of the first metal films M1 (M11 and M12), the second metal films M2 (M21 and M22) with thicknesses thinner than the first metal films M1 (M11 and M12) are bonded. The first metal films M1 (M11 and M12) are bonded to the second metal films M2 (M21 and M22). This also improves bonding strength of the first metal films M1 (M11 and M12) and the second metal films M2 (M21 and M22), thus ensuring stable bonding strength in the entire metal film. Especially, in this embodiment, the first metal films M1 (M11 and M12) and the second metal films M2 (M21 and M22) are formed of the same material. This provides preferred bonding strength and preferred stabilization of formation by plating. That is, the thinner second metal films M2 (M21 and M22) are at least partially interposed between the first metal films M1 (M11 and M12) and the connecting electrodes 295 and 296. This provides an anchor effect and improves strength compared with direct bonding of the first metal films M1 (M11 and M12) to the connecting electrodes 295 and 296, thus ensuring more stable bonding. Especially, in the case where mutual bonding strength is weak between the first metal films M1 (M11 and M12) and the connecting electrodes 295 and 296, cracking may occur due to a mechanical stress between the first metal films M1 (M11 and M12) and the connecting electrodes 295 and 296 when ultrasonic bonding is performed or when an impact such as dropping occurs after the bond of the connecting electrodes 295 and 296. This may cause trouble such as disconnection. However, in this embodiment, such trouble does not occur.

In the short side portion 231 that is the base end portion of the bonding portion 23 as a bonding region, the first metal films M1 (M11 and M12) and the second metal films M2 (M21 and M22) are formed by a photolithography method. This improves positioning accuracy when the first metal films M1 (M11 and M12) and the second metal films M2 (M21 and M22) are formed into the tuning-fork type crystal resonator plate 2. Accordingly, even in the case where the bonding portion 23 of the tuning-fork type crystal resonator plate 2 becomes smaller, this configuration allows forming of the first metal films M1 (M11 and M12) as bonding materials in appropriate positions of the tuning-fork type crystal resonator plate 2. Additionally, this allows collective forming of at least one of the first metal films M1 (M11 and M12) and the second metal films M2 (M21 and M22) along with the formation of another metallic material of the tuning-fork type crystal resonator plate 2. Especially, in the case of the tuning-fork type crystal resonator plate 2, the adjustment metal film M3, which is described below, formed at the distal ends of the first leg portion 21 and the second leg portion 22 is formed along with at least one of the first metal films M1 (M11 and M12) and the second metal films M2 (M21 and M22). This eliminates the increase of unnecessary processes, thus improving takt time.

Additionally, passing through the first process to the third process as described above facilitates forming of the first metal films M1 (M11 and M12) and the second metal films M2 (M21 and M22) that have surface roughnesses larger than those of the connecting electrodes 295 and 296. Regarding the thin second metal films M2 (M21 and M22), this allows stable formation of plated films in the upper portion of the connecting electrodes 295 and 296 with not larger surface roughnesses. Even in the case of the thick first metal films M1 (M11 and M12), forming the first metal films M1 (M11 and M12) in the upper portion of the second metal films M2 (M21 and M22) with rough surfaces reduces influence of a difference in growth speed of the plated films at the boundary between the films, thus stably growing the plated films. Additionally, on the top surfaces of the first metal films M1 (M11 and M12), this allows forming of three protruding portions T (T1, T2, and T3) along the top surface end portions of the first metal films M1 (M11 and M12) excluding the center regions M0 (M01 and M02) on the top surfaces of the first metal films M1 (M11 and M12). The functions of the second metal films M2 (M21 and M22) as anchors improves final bonding strength between the first metal films M1 (M11 and M12) and the connecting electrodes 295 and 296, thus ensuring stable bonding strength. Additionally, a multipoint anchor where a plurality of these second metal films M2 (M21 and M22) are interposed further improves the bonding strength. The thickness difference of the second metal films M2 (M21 and M22) facilitates forming of the protruding portions T (T1, T2, and T3) with the cross-sections in curvature shapes on the top surfaces of the first metal films M1 (M11 and M12). The first metal films M1 (M11 and M12) and the second metal films M2 (M21 and M22) are formed by a batch process without generating mechanical stress loading on the tuning-fork type crystal resonator plate 2. This allows lower-cost fabrication, thus providing an extremely high degree of freedom for designing surface areas, shapes, and thicknesses.

The first metal films M1 (M11 and M12) of the tuning-fork type crystal resonator plate 2 that provides the above-described operation and effect are bonded to the electrode pad 32 of the base 3 by ultrasonic bonding. Accordingly, this simultaneously further stabilizes and improves electrical and mechanical bonding strength between the connecting electrodes 295 and 296 of the tuning-fork type crystal resonator plate 2 and the electrode pad 32 of the base 3. As a result, this provides the tuning-fork type crystal resonator 1 that is low-price, has a more stable electrical characteristic and higher reliability, and is effective for downsizing. Especially, in the case where the piezoelectric resonator plate is the tuning-fork type crystal resonator plate 2, if electrical and mechanical bonding strength between the connecting electrodes 295 and 296 of the tuning-fork type crystal resonator plate 2 and the electrode pad 32 of the base 3 becomes unstable, the electrical characteristic of the tuning-fork type crystal resonator 1 may be degraded due to vibration leakage (sound leakage), or a shift of the oscillation frequency of the tuning-fork type crystal resonator 1 and similar trouble may occur due to the application of an external force to the tuning-fork type crystal resonator plate 2 or similar cause. However, the present invention significantly reduces these troubles.

Next, other embodiments of the present invention will be described by referring to FIGS. 5A to 5D. In plan view of FIG. 5A, a tuning-fork type crystal resonator plate 2 in a straight shape is employed. On the principal surfaces of the respective leg portions, no groove portion is formed. In the distal end portions of the respective leg portions, no broader region is formed. The bonding portions are eliminated. The tuning-fork type crystal resonator plate 2 thus configured is often used for a tuning-fork type crystal resonator plate comparatively larger in size, and have a simple and low-cost configuration compared with the above-described tuning-fork type crystal resonator plate 2. The present invention is applicable to this tuning-fork type crystal resonator plate 2 with the simple configuration. The embodiment illustrated in FIG. 5A includes first metal films M1 with larger surface roughnesses and smaller areas than those of the connecting electrodes 295 and 296 on the principal surfaces in the base portion. These first metal films M1 have circular shapes in plan view. Accordingly, on the top surfaces of the first metal films M1, four protruding portions T are formed in, for example, circular shapes in plan view with cross-sections in curvature shapes.

In this embodiment, the piezoelectric resonator plate is not limited to the tuning-fork type piezoelectric resonator plate with flexural vibration. The piezoelectric resonator plate is applicable to, for example, an AT-cut piezoelectric resonator plate in a thickness-shear vibration mode or other modes. Alternatively, the piezoelectric resonator plate is applicable to, for example, a piezoelectric resonator plate in another shape such as a plate shape and a reverse-mesa shape. In plan view of FIG. 5B, a rectangular-plate-shaped crystal resonator plate 4 with thickness-shear vibration, such as an AT-cut, is employed. In the embodiment illustrated in FIG. 5B, compared with connecting electrodes 495 and 496 formed in end portions of the principal surfaces of the crystal resonator plate 4, first metal films M1 have larger surface roughnesses and smaller areas. These first metal films M1 have circular shapes in plan view. Accordingly, on the top surfaces of the first metal films M1, four protruding portions T are formed in, for example, circular shapes in plan view with cross-sections in curvature shapes.

In plan view of FIG. 5C, a rectangular-plate-shaped crystal resonator plate 4 made of an AT-cut or similar where a narrow bridge portion K1 is formed is employed. In the embodiment illustrated in FIG. 5C, compared with connecting electrodes 495 and 496 formed in a bonding portion K2 at a distal end portion of the bridge portion K1 in the crystal resonator plate 4, first metal films M1 have larger surface roughnesses and smaller areas. These first metal films M1 have circular shapes in plan view. Accordingly, on the top surface of the first metal film M1, four protruding portions T are formed in, for example, circular shapes in plan view with cross-sections in curvature shapes. In the configuration of FIG. 5C, the narrow bridge portion K1 provides a configuration that reduces transmission of, for example, unnecessary stress from the bonding portion K2 to a vibration region K3. While in this configuration mechanical strength of the bridge portion K1 is easily degraded, forming the first metal films M1 with the protruding portions T of this embodiment ensures bonding with a smaller pressing force, for example, when ultrasonic bonding is performed. This eliminates damage on the bridge portion K1. That is, this eliminates cracking or breaking of the bridge portion K1.

In the cross-sectional view of FIG. 5D, a rectangular-plate-shaped crystal resonator plate 4 made of a AT-cut or similar where a partial thin vibration region S1 and a thick supporting region S2 are formed what is called a reverse-mesa configuration is employed. In the embodiment illustrated in FIG. 5D, compared with connecting electrodes 495 and 496 (connecting electrode 496 is not shown) formed in the supporting region S2 of the crystal resonator plate 4, first metal films M1 have larger surface roughnesses and smaller areas. Accordingly, on the top surfaces of the first metal films M1, protruding portions T are formed with cross-sections in curvature shapes. In this embodiment, in a part of the supporting region S2 of the crystal resonator plate 4, performing etching or similar process to a main base material of the crystal resonator plate so as to form protruding portions S3 and S3. In the upper portion of these protruding portions, forming the first metal films M1 constitutes the protruding portions T with the cross-sections in curvature shapes. In this respect, this configuration is different from those of the above-described embodiments. In the configuration of FIG. 5D, the thinner vibration region S1 provides the configuration that deals with high frequency. While in this configuration, mechanical strength of a coupling region S4 between the thin vibration region S1 and the thick supporting region S2 is easily degraded, the formation of the first metal films M1 with the protruding portions T of this embodiment ensures bonding with a smaller pressing force, for example, when ultrasonic bonding is performed. This eliminates damage on the coupling region S4. That is, this eliminates cracking or breaking of the coupling region S4.

Figure 6:
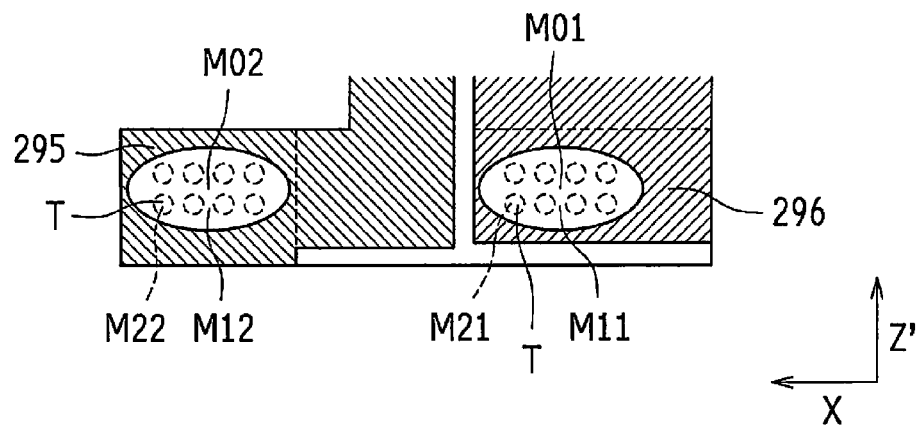
FIG. 6 is a partially enlarged plan view of another embodiment corresponding to FIGS. 4A and 4B.
Figure 7:
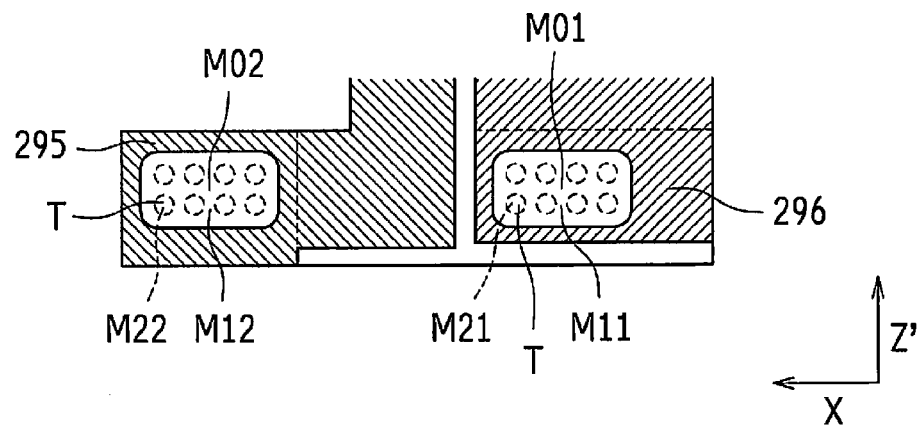
FIG. 7 is a partially enlarged plan view of another embodiment corresponding to FIGS. 4A and 4B.

In the above-described embodiments, as illustrated in FIGS. 2 and 4, the first metal films M1 (M11 and M12) that have circular shapes in plan view and include the protruding portions T are formed. This should not be construed in a limiting sense. As illustrated in FIG. 6, first metal films M1 that have elliptical shapes in plan view with a longitudinal direction in the X axis direction and a short side direction in the Z' axis direction may be possible. As illustrated in FIG. 7, first metal films M1 formed in rectangular shapes in plan view with long sides along the X axis direction and short sides along the Z' axis direction may be possible. In these first metal films M1 illustrated in FIGS. 6 and 7, the protruding portions T are arranged in four rows along the X axis direction and two columns along the Z' axis direction. In total, the eight protruding portions T (the X axis direction x the Z' axis direction=4×2) are arranged. The number of protruding portions T illustrated in FIGS. 6 and 7 may be set to any number. In the case where the number of protruding portions T in the X axis direction is larger than the number of protruding portions T in the Z' axis direction, this configuration provides significant operation and effect thanks to the shapes of the first metal films M1 illustrated in FIGS. 6 and 7.

With the above-described embodiments illustrated in FIGS. 6 and 7, the first metal films M1 have the elliptical shape in plan view and the rectangular shape in plan view that each have a longitudinal direction in the X axis direction and a short side direction in the Z' axis direction. Accordingly, even when vibration in the Z' axis direction of the tuning-fork type crystal resonator plate 2 occurs after the tuning-fork type crystal resonator plate 2 is bonded on the base 3 by ultrasonic bonding, the first metal films M1 (M11 and M12) functioning as plated bumps receive the vibration on ridges in the longitudinal direction (in the X axis direction). This disperses damage on the bonding portion between the base 3 and the tuning-fork type crystal resonator plate 2 via the plated bumps. As a result, this suppresses occurrence of film delamination of the connecting electrodes 295 and 296 bonded to the plated bumps or similar problem, thus improving bonding strength. When ultrasonic bonding is performed on the tuning-fork type crystal resonator plate 2, the first metal films M1 (M11 and M12) functioning as the plated bumps receive the ultrasonic vibration on the ridges in the longitudinal direction (in the X axis direction). This suppresses excessive crush of the first metal films in the thickness direction (the Y direction).

Figure 8:
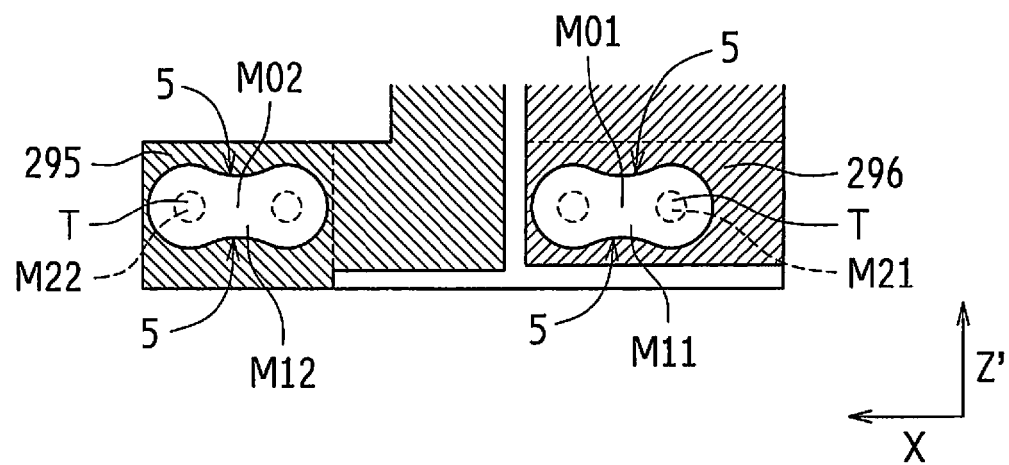
FIG. 8 is a partially enlarged plan view of another embodiment corresponding to FIGS. 4A and 4B.

In the above-described embodiments, as illustrated in FIGS. 2 and 4, the first metal films M1 (M11 and M12) that have circular shapes in plan view and include the protruding portions T are formed. This should not be construed in a limiting sense. As illustrated in FIG. 8, first metal films M1 that have elliptical shapes in plan view with a longitudinal direction in the X axis direction and a short side direction in the Z' axis direction may be possible. In the first metal films M1 illustrated in FIG. 8, lengths of the short sides are short in the center regions (central portions in the longitudinal direction), and depressed portions 5 are formed in the center regions. One protruding portion T is disposed for each region of both end portions in the longitudinal direction.

With the first metal films M1 that have the depressed portions 5 illustrated in FIG. 8, similarly to the above-described embodiments illustrated in FIGS. 6 and 7, the first metal films M1 have the elliptical shape in plan view and the rectangular shape in plan view that each have a longitudinal direction in the X axis direction and a short side direction in the Z' axis direction. Accordingly, even when vibration in the Z' axis direction of the tuning-fork type crystal resonator plate 2 occurs after the tuning-fork type crystal resonator plate 2 is bonded on the base 3 by ultrasonic bonding, the first metal films M1 (M11 and M12) functioning as plated bumps receive the vibration on ridges in the longitudinal direction (in the X axis direction). This disperses damage on the bonding portion between the base 3 and the tuning-fork type crystal resonator plate 2 via the plated bumps. As a result, this suppresses occurrence of film delamination of the connecting electrodes 295 and 296 bonded to the plated bumps or similar trouble, thus improving bonding strength. Additionally, the first metal films M1 illustrated in FIG. 8 include the depressed portions 5 with gentle curves. These depressed portions 5 may be approximately assumed to be regions that include continuous short line regions. Accordingly, not only when vibration in the Z' axis direction of the tuning-fork type crystal resonator plate 2 occurs, but also when vibration in an axial direction inclined in a direction from the Z' axis to the X axis (for example, at the time of dropping in an axial direction inclined in a direction from the Z' axis to the X axis as a dropping direction), end edge portions (any point on lines forming outlines of the depressed portions 5) of the depressed portions 5, which are end edges of the first metal films M1 (M11 and M12) functioning as the plated bumps, receive the vibration. This disperses damage on the bonding portion between the base 3 and the tuning-fork type crystal resonator plate 2 via the plated bumps in the thickness direction (the Y axis direction). As a result, this ensures a stable bonding state of the tuning-fork type crystal resonator plate 2 to the base 3.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application is based on and claims priority to Japanese Patent Application 2011-039414, filed on Feb. 25, 2011, the entire contents of which are incorporated herein by reference.

INDUSTRIAL APPLICABILITY

The present invention is applicable to a piezoelectric resonator device such as a crystal resonator.

DESCRIPTION OF REFERENCE SIGNS 1 tuning-fork type crystal resonator
2 tuning-fork type crystal resonator plate
21 first leg portion
211 distal end portion
22 second leg portion
221 distal end portion
23 bonding portion
231 short side portion
232 long side portion
233 distal end portion
234 folded portion
235 one principal surface
25 base portion
251 one end surface
252 the other end surface
253 gap portion
261 one principal surfaces of first leg portion and second leg portion
262 the other principal surfaces of first leg portion and second leg portion
27 groove portion
28 side surface
291 first excitation electrode
292 second excitation electrode
293 and 294 extraction electrode
295 and 296 connecting electrode
3 base
30 dike portion
31 level difference portion
32 electrode pad
33 terminal electrode
34 metallized layer
4 crystal resonator plate
495 and 496 connecting electrode
5 depressed portion
H sealing member
K1 bridge portion
K2 bonding portion
M0 (M01 and M02) center region
M1 (M11 and M12) first metal film
M2 (M21 and M22) second metal film
M3 adjustment metal film (frequency adjustment weight)
S1 vibration region
S2 supporting region
S3 protruding portion
T (T1, T2, and T3) protruding portion

The invention claimed is:
1. A piezoelectric resonator plate comprising:
at least a pair of excitation electrodes; and
at least a pair of extraction electrodes that are respectively extracted from the pair of excitation electrodes to electrically and mechanically bond the pair of excitation electrodes to an external electrode, wherein
the pair of extraction electrodes each include a distal end portion, the distal end portion including a connecting electrode extracted to a vicinity of one end portion on one principal surface of the piezoelectric resonator plate, the connecting electrodes each include a top surface where a first metal film to be bonded to the external electrode is formed, the first metal film has a larger surface roughness and a smaller area compared with the respective connecting electrodes, the first metal film including a to surface with two or more protruding portions, the protruding portions are formed with cross-sections in curvature shapes, and the top surface of the first metal film includes two or more protruding portions along a top surface end portion of the first metal film excluding a center region on the top surface of the first metal film.

2. The piezoelectric resonator plate according to claim 1, further comprising a second metal film formed between the first metal film and the connecting electrode, the second metal film having a surface roughness larger than a surface roughness of the connecting electrode, and having a smaller area and a smaller thickness compared with the first metal film.

3. A piezoelectric resonator, wherein the piezoelectric resonator plate according to claim 1 is bonded to a terminal electrode of a substrate, the terminal electrode being an external electrode.

* * * * *